(12) United States Patent
Noguchi et al.

(10) Patent No.: US 11,340,412 B2
(45) Date of Patent: May 24, 2022

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

( * ) Notice: Subject to any disclaimer, the term of this patent is extended or adjusted under 35 U.S.C. 154(b) by 36 days.

(21) Appl. No.: 17/137,463

(22) Filed: Dec. 30, 2020

(65) Prior Publication Data

US 2021/0271038 A1 Sep. 2, 2021

(30) Foreign Application Priority Data

Feb. 28, 2020 (JP) .............................. JP2020-033415
Jul. 14, 2020 (JP) .............................. JP2020-120783

(51) Int. Cl.
*H04B 10/00* (2013.01)
*G02B 6/42* (2006.01)

(52) U.S. Cl.
CPC ......... *G02B 6/4292* (2013.01); *G02B 6/4214* (2013.01); *G02B 6/4246* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,768,070 A * | 8/1988 | Takizawa | ............ | H01S 5/02326 372/75 |
| 5,068,866 A * | 11/1991 | Wada | ...................... | H01L 24/97 372/49.01 |
| 5,089,861 A * | 2/1992 | Tanaka | .................. | H01S 5/0231 257/680 |
| 5,550,675 A * | 8/1996 | Komatsu | ............. | H01L 31/0203 257/E31.118 |
| 5,557,116 A * | 9/1996 | Masui | ................... | H01S 5/0231 257/690 |
| 6,562,693 B2 * | 5/2003 | Ichikawa | ................ | H01L 24/85 257/82 |
| 6,807,207 B2 * | 10/2004 | Shiomoto | ............. | H01S 5/4043 372/36 |
| 6,868,104 B2 * | 3/2005 | Stewart | ............... | H01S 5/02212 372/36 |

(Continued)

FOREIGN PATENT DOCUMENTS

JP 2011-123188 A 6/2011
JP 2017-050357 A 3/2017

*Primary Examiner* — Agustin Bello
(74) *Attorney, Agent, or Firm* — Mattingly & Malur, PC

(57) ABSTRACT

The relay board includes a first end face opposed to and fixed to the first surface of the conductive block, a second end face opposite to the first end face, and a top and a bottom defining thickness of the relay board. The top has a slope at a position closer to the first end face than the second end face. The slope inclines such that the thickness decreases in a direction from the first end face to the second end face. The conductor layers include a signal pattern on the top with part of the signal pattern disposed on the slope, and a first ground pattern extending from the bottom to each of the first end face and the second end face. The signal wire has one end bonded to the signal lead pin and another end bonded to the signal pattern on the slope.

21 Claims, 13 Drawing Sheets

(56) References Cited

U.S. PATENT DOCUMENTS

| | | | | |
|---|---|---|---|---|
| 6,876,685 B2* | 4/2005 | Umemoto | H01S 5/02257 | 372/36 |
| D505,664 S * | 5/2005 | Takagi | D13/182 | |
| 6,920,161 B2* | 7/2005 | Riaziat | H01S 5/0683 | 372/36 |
| 6,920,162 B2* | 7/2005 | Harding | H01L 33/647 | 372/109 |
| 7,037,001 B2* | 5/2006 | Oomori | H01S 5/02212 | 372/31 |
| 7,046,707 B2* | 5/2006 | Koizumi | H01S 5/0233 | 372/36 |
| 7,061,949 B1* | 6/2006 | Zhou | H01S 5/02257 | 372/36 |
| 7,154,126 B2* | 12/2006 | Aruga | G02B 6/4279 | 257/432 |
| 7,263,112 B2* | 8/2007 | Oomori | H01S 5/02212 | 372/36 |
| 7,358,542 B2* | 4/2008 | Radkov | C09K 11/778 | 257/E33.061 |
| 7,366,215 B2* | 4/2008 | Aruga | H01S 5/02345 | 372/38.1 |
| 7,463,659 B2* | 12/2008 | Go | H01S 5/02212 | 372/36 |
| 7,837,398 B2* | 11/2010 | Sato | H01S 5/02253 | 385/92 |
| 7,856,038 B2* | 12/2010 | Oomori | H01S 5/023 | 372/36 |
| 7,991,029 B2* | 8/2011 | Aruga | H05K 1/0243 | 372/29.013 |
| 8,509,575 B2* | 8/2013 | Okada | H01S 5/02345 | 372/36 |
| 8,743,564 B2* | 6/2014 | Kuwahara | H01L 31/0203 | 257/432 |
| 9,059,569 B2* | 6/2015 | Yamanaka | H01S 5/02345 | |
| 9,209,903 B2* | 12/2015 | Lee | H01S 5/02415 | |
| 9,372,315 B2* | 6/2016 | Miao | G02B 6/421 | |
| 9,541,714 B2* | 1/2017 | Lim | H04B 10/40 | |
| 9,625,671 B2* | 4/2017 | Vorndran | G02B 19/0014 | |
| 9,859,680 B2* | 1/2018 | Serbicki | H01S 5/02212 | |
| 9,980,379 B2* | 5/2018 | Noguchi | H05K 1/025 | |
| 10,168,493 B2* | 1/2019 | Shirasaki | G02B 6/4266 | |
| 10,211,599 B2* | 2/2019 | Vorndran | H01S 5/02253 | |
| 10,334,717 B2* | 6/2019 | Noguchi | H05K 1/0274 | |
| 10,431,955 B2* | 10/2019 | Serbicki | H01S 5/3402 | |
| 10,763,638 B2* | 9/2020 | Jungwirth | H01S 5/02212 | |
| 10,771,155 B2* | 9/2020 | McLaurin | H04B 10/116 | |
| 10,819,084 B2* | 10/2020 | Zhang | H01S 5/02212 | |
| 10,852,493 B2* | 12/2020 | Noguchi | G02B 6/4244 | |
| 11,153,962 B2* | 10/2021 | Kimura | H05K 7/1427 | |
| 11,206,087 B2* | 12/2021 | Otani | G02F 1/017 | |
| 11,256,048 B2* | 2/2022 | Hettier | G02B 6/12033 | |
| 2001/0006235 A1* | 7/2001 | Ozawa | H01L 33/40 | 257/712 |
| 2003/0043868 A1* | 3/2003 | Stewart | H01S 5/02212 | 372/36 |
| 2003/0086243 A1* | 5/2003 | Harding | H01L 33/647 | 361/700 |
| 2003/0214860 A1* | 11/2003 | Greenlaw | H05K 1/0253 | 365/200 |
| 2003/0218923 A1* | 11/2003 | Giaretta | H01S 5/02212 | 365/200 |
| 2004/0074661 A1* | 4/2004 | Schiaffino | H01S 5/02212 | 257/E23.19 |
| 2004/0081410 A1* | 4/2004 | Aronson | H01S 5/02212 | 257/E23.19 |
| 2004/0151505 A1* | 8/2004 | Aronson | H01S 5/02212 | 257/E23.19 |
| 2004/0163836 A1* | 8/2004 | Kumar | H01S 5/02212 | 257/E23.19 |
| 2004/0240497 A1* | 12/2004 | Oomori | H01S 5/02212 | 372/36 |
| 2004/0247004 A1* | 12/2004 | Keh | H01S 5/02212 | 372/36 |
| 2005/0008049 A1* | 1/2005 | Oomori | H01S 5/02325 | 372/36 |
| 2005/0013561 A1* | 1/2005 | Kuhara | G02B 6/4243 | 385/92 |
| 2005/0047460 A1* | 3/2005 | Go | H01S 5/02212 | 372/36 |
| 2005/0067698 A1* | 3/2005 | Aruga | H01S 5/0427 | 257/737 |
| 2005/0105911 A1* | 5/2005 | Keh | H01S 5/02212 | 398/138 |
| 2005/0121684 A1* | 6/2005 | Aruga | G02B 6/4292 | 257/98 |
| 2005/0141825 A1* | 6/2005 | Lee | H01L 31/02005 | 385/92 |
| 2005/0175299 A1* | 8/2005 | Hargis | G02B 6/4292 | 385/92 |
| 2005/0185882 A1* | 8/2005 | Zack | G02B 6/4256 | 385/15 |
| 2005/0196112 A1* | 9/2005 | Takagi | H01L 24/78 | 385/94 |
| 2005/0201433 A1* | 9/2005 | Riaziat | H01S 5/0683 | 372/36 |
| 2005/0207459 A1* | 9/2005 | Yu | H01L 31/0203 | 257/E31.118 |
| 2006/0007516 A1* | 1/2006 | Kagaya | G02F 1/0121 | 359/245 |
| 2006/0072883 A1* | 4/2006 | Kilian | G02B 6/4204 | 385/33 |
| 2006/0176918 A1* | 8/2006 | Aruga | H01S 5/02345 | 372/38.1 |
| 2007/0120134 A1* | 5/2007 | Oshima | H01S 5/02345 | 257/82 |
| 2007/0201881 A1* | 8/2007 | Douma | G02B 6/4246 | 257/E31.118 |
| 2007/0237196 A1* | 10/2007 | Oomori | H01S 5/0235 | 372/36 |
| 2009/0135864 A1* | 5/2009 | Aruga | H05K 1/0243 | 372/29.02 |
| 2009/0269067 A1* | 10/2009 | Kihara | H04J 14/02 | 398/79 |
| 2010/0008093 A1* | 1/2010 | Lin | H01L 31/0203 | 362/365 |
| 2010/0213471 A1* | 8/2010 | Fukasawa | H01S 3/0405 | 257/E33.056 |
| 2011/0085767 A1* | 4/2011 | Miao | G02B 6/4267 | 385/88 |
| 2012/0045161 A1* | 2/2012 | Okada | H01S 5/02345 | 385/1 |
| 2014/0037293 A1* | 2/2014 | Lee | H01S 5/02212 | 398/79 |
| 2015/0008552 A1* | 1/2015 | Matsusue | H01S 5/0262 | 257/431 |
| 2015/0116809 A1* | 4/2015 | Uto | H01S 5/02208 | 359/245 |
| 2016/0036192 A1* | 2/2016 | Serbicki | H01S 5/02212 | 29/879 |
| 2016/0276802 A1* | 9/2016 | Gao | H01S 5/02415 | |
| 2017/0063464 A1* | 3/2017 | Ho | G02B 6/3831 | |
| 2017/0064831 A1* | 3/2017 | Noguchi | H05K 1/025 | |
| 2017/0133821 A1* | 5/2017 | Kimura | H01S 5/02469 | |
| 2018/0003908 A1* | 1/2018 | Jung | G02B 6/4245 | |
| 2019/0074658 A1* | 3/2019 | Jungwirth | H01S 5/02325 | |
| 2020/0064572 A1* | 2/2020 | Hettier | H01S 5/02212 | |
| 2020/0203922 A1* | 6/2020 | Zhang | H01S 5/022 | |
| 2020/0337147 A1* | 10/2020 | Kimura | H05K 7/1427 | |
| 2021/0165177 A1* | 6/2021 | Chang | G02B 6/4257 | |
| 2021/0184056 A1* | 6/2021 | Noguchi | H01L 31/02005 | |
| 2021/0218473 A1* | 7/2021 | Otani | H01S 5/02345 | |
| 2021/0271038 A1* | 9/2021 | Noguchi | G02B 6/4246 | |
| 2021/0281042 A1* | 9/2021 | Krause | H01S 5/02415 | |
| 2021/0333496 A1* | 10/2021 | Chang | G02B 6/4246 | |

\* cited by examiner

OPTICAL MODULE

CROSS-REFERENCE TO RELATED APPLICATION

The present application claims priority from Japanese patent applications JP2020-033415 filed on Feb. 28, 2020 and JP2020-120783 filed on Jul. 14, 2020, the contents of which are hereby incorporated by reference into this application.

BACKGROUND

1. Field

The present invention relates to an optical module.

2. Description of the Related Art

A TO-CAN (Transistor Outline Can) type package is configured to transmit electric signals to an optical semiconductor device by using lead pins held in respective through holes of an eyelet via a dielectric such as glass (JP 2017-50357A and JP 2011-123188A). The lead pins are bonded to a wiring pattern of the ceramic substrate by brazing or soldering.

The brazing or soldering allows for a reduction in inductance because it uses no wire, but it requires expensive pellets (e.g., AuSn solder). In addition, although it is necessary to arrange the lead pins at respective accurate positions for brazing or soldering, the position control thereof is difficult.

SUMMARY

This aims at an electrical connection using a wire so that the inductance is not increased.

(1) An optical module includes: a conductive block with a first surface and a second surface, the conductive block having some through holes extending therethrough between the first surface and the second surface; some lead pins including a signal lead pin, the lead pins fixed inside the respective through holes and insulated from the conductive block; a relay board including two or more layers in which some conductor layers are arranged with an insulating layer interposed therebetween; a photoelectric device configured to convert an optical signal and an electrical signal at least from one to another; and some wires including a signal wire. The relay board includes a first end face opposed to and fixed to the first surface of the conductive block, the relay board including a second end face opposite to the first end face, the relay board including a top and a bottom defining thickness of the relay board between the first end face and the second end face. The top has a slope at least at a position closer to the first end face than the second end face, the slope inclining such that the thickness decreases in a direction from the first end face to the second end face. The conductor layers include a signal pattern on the top with part of the signal pattern disposed on the slope, the conductor layers including a first ground pattern extending from the bottom to each of the first end face and the second end face. The signal wire has one end bonded to the signal lead pin and another end bonded to the signal pattern on the slope.

Use of the signal wire can minimize costs. Additionally, bonding the signal wire to the slope can simplify its bonding process, whereby a short signal wire can be used and inductance can be reduced.

(2) In the optical module according to (1), the conductor layers may include a second ground pattern located in an inner layer of the relay board and electrically connected to the first ground pattern.

(3) In the optical module according to (1) or (2), the wires may include a ground wire with one end bonded to the first ground pattern on the second end face.

(4) In the optical module according to (3), the conductive block may have a pedestal portion raised on the first surface, and the ground wire may have another end bonded to the pedestal portion.

(5) The optical module according to any one of (1) to (4) may further include a conductive adhesive interposed between the first surface and the first end face, adapted to electrically connect the first ground pattern to the conductive block, and adapted to fix the relay board to the conductive block.

(6) In the optical module any one of (1) to (5), the relay board may be supported by the conductive block only at the first end face.

(7) In the optical module according to any one of (1) to (6), at least part of the relay board does not have to overlap with any one of the through holes.

(8) In the optical module according to any one of (1) to (7), the signal wire may be bonded to a distal end face of the signal lead pin.

(9) In the optical module according to (8), the signal lead pin may have a held portion located inside a corresponding one of the through holes, and the distal end face may be larger than a diameter of the held portion.

(10) In the optical module according to any one of (1) to (9), the wires may further include a wire bonded to the signal pattern on the top.

(11) In the optical module according to any one of (1) to (10), the signal pattern may include a signal line and a pad portion larger than a line width of the signal line, and the pad portion may be positioned on the slope.

(12) In the optical module according to any one of (1) to (11), the first ground pattern may be configured to extend from the bottom to the second end face.

(13) In the optical module according to (12), the first ground pattern may be configured to extend beyond the second end face to the top.

(14) In the optical module according to (13), the wires may further include a wire bonded to the first ground pattern on the top.

(15) In the optical module according to (1) to (10), the relay board may be each of a first relay board and a second relay board, and the signal pattern of the first relay board and the signal pattern of the second relay board may constitute a differential transmission line.

(16) An optical module includes: a conductive block with a first surface and a second surface, the conductive block having some through holes extending therethrough between the first surface and the second surface; some lead pins including a signal lead pin, the lead pins fixed inside the respective through holes and insulated from the conductive block; a relay board including two or more layers in which some conductor layers are arranged with an insulating layer interposed therebetween; a photoelectric device configured to convert an optical signal and an electrical signal at least from one to another; and some wires including a signal wire. The relay board includes a first end face opposed to and fixed to the first surface of the conductive block, the relay board including a second end face opposite to the first end face, the relay board including a top and a bottom defining thickness of the relay board between the first end face and the second end face. The top has a slope inclining such that the thickness decreases in a direction from the first end face to the second end face. The conductor layers include a signal pattern on the slope, the conductor layers including a first ground pattern on the bottom, the conductor layers including a first conductor embedded in the relay board, the first conductor including a first bare surface exposed to the first end face, the first conductor connected to the first ground pattern. The signal wire has one end bonded to the signal lead pin and another end bonded to the signal pattern on the slope.

(17) In the optical module according to (16), the conductor layers may further include a second conductor embedded in the relay board, the second conductor may include a second bare surface exposed to the second end face, and the second conductor may be connected to the first ground pattern.

(18) The optical module according to (17) may further include a conductive piece in face contact with the second bare surface of the second conductor, at least a surface of the conductive piece may be made of a conductive material. The wires may include a ground wire with one end bonded to the surface of the conductive piece.

(19) In the optical module according to (18), the conductive piece may be entirely made of the conductive material.

(20) In the optical module according to (18), the conductive piece may include a main body made of an insulating material, the conductive piece may include a metal film on the main body, one portion of the metal film may be a connection portion to the second bare surface, and another portion of the metal film may be a bonding portion to the ground wire, without being opposed to the second end face.

(21) In the optical module according to any one of (18) to (20) may further include: a mounting substrate on which the photoelectric device is mounted; and a support block configured to support the mounting substrate, made of a conductive material, and bonded to another end of the ground wire.

DETAILED DESCRIPTION

Figure 1:
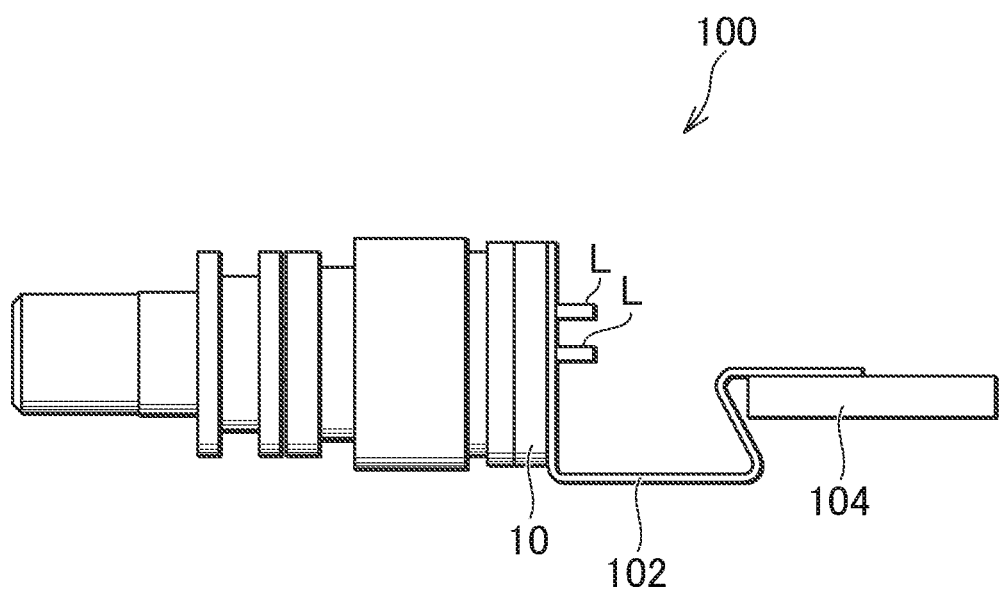
FIG. 1 is a perspective view of an optical module in a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

FIG. 1 is a perspective view of an optical module in a first embodiment. The optical module 100 is a TO-CAN (Transistor Outline-Can) type optical module, and may be any of a transmitter optical sub-assembly (TOSA) including a light emitter, a receiver optical sub-assembly (ROSA) including a light receiver, a bidirectional optical sub-assembly (BOSA) including both a light emitter and a light receiver. The optical module 100 has a flexible printed circuit board (FPC) 102, which is connected to a printed circuit board (PCB) 104. The optical module 100 has a conductive block 10 (e.g., eyelet).

Figure 2:
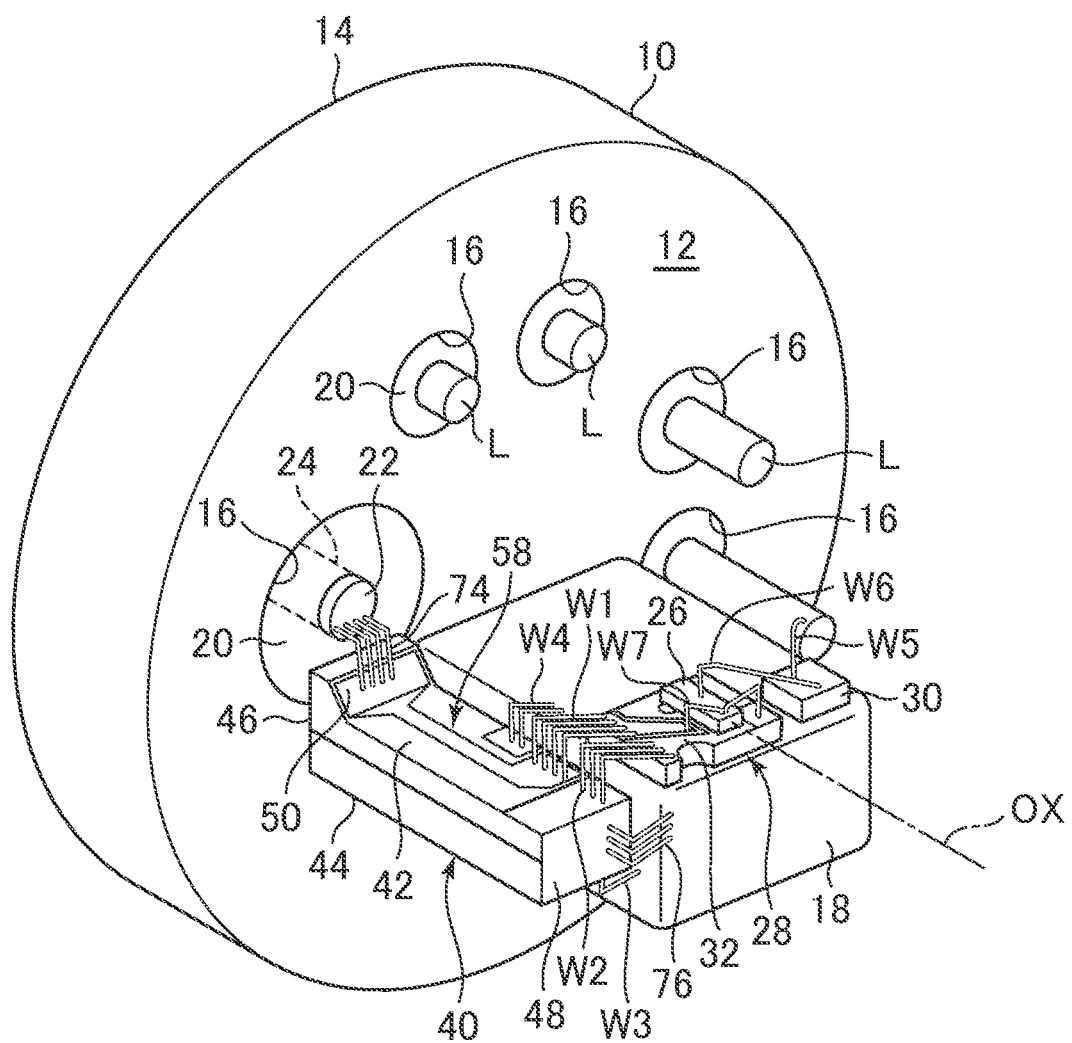
FIG. 2 is a perspective view of a conductive block and electronic components on it.

FIG. 2 is a perspective view of the conductive block 10 and electronic components on it. The conductive block 10 is made of a conductive material such as metal, and has a first surface 12 and a second surface 14. The conductive block 10 has some through holes 16 penetrating therethrough between the first surface 12 and the second surface 14. The conductive block 10 has a pedestal portion 18 integral to the first surface 12. The pedestal portion 18 is raised on the first surface 12. The pedestal portion 18 is also made of a conductor. The conductive block 10 is connected to a reference potential (e.g., ground).

The optical module 100 has some lead pins L. The lead pins L are fixed inside the respective through holes 16 and insulated from the conductive block 10. For example, each through hole 16 is filled with an insulating material 20 such as glass. The lead pins L project from the first surface 12. The lead pins L also protrude from the second surface 14 and are connected to the flexible printed circuit board 102 (FIG. 1).

The lead pins L include a signal lead pin 22. The signal lead pin 22 has a held portion 24 located inside a corresponding one of the through holes 16. The signal lead pin 22 is inside the through hole 16 of the conductive block 10 in the reference potential, constituting a coaxial line. The signal lead pin 22 has a distal end face larger than a diameter of the held portion 24.

The optical module 100 has a photoelectric device 26 adapted to convert an optical signal and an electrical signal at least from one to another. The photoelectric device 26 is adapted to be driven in a single-ended manner. The photoelectric device 26 is mounted on a mounting substrate 28. The mounting substrate 28 is mounted on the pedestal portion 18. A bypass capacitor 30 is mounted on the pedestal portion 18. The bypass capacitor 30 has a bottom (electrode) conducted to the pedestal portion 18, being connected to the reference potential (e.g., ground).

The mounting substrate 28 has a mounting surface on which the photoelectric device 26 is mounted. The photoelectric device 26 is disposed such that its optical axis OX extends in a direction parallel to the mounting surface. The mounting substrate 28 has a wiring pattern 32 on the mounting surface.

Figure 3:
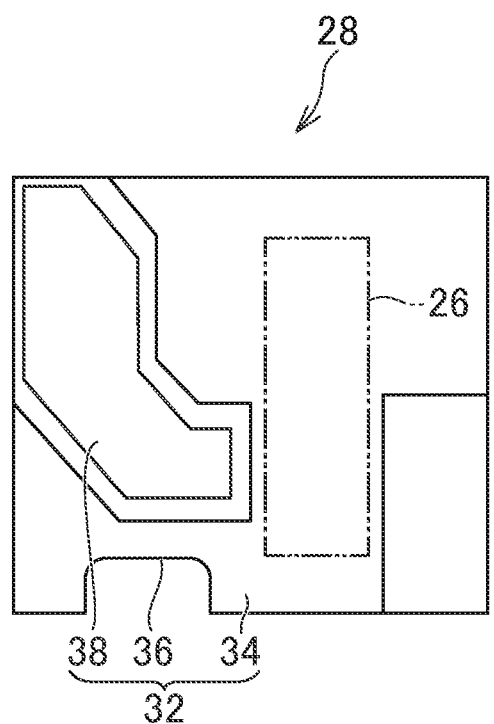
FIG. 3 is a plan view of a wiring pattern.

FIG. 3 is a plan view of the wiring pattern 32. The wiring pattern 32 is electrically connected to the photoelectric device 26. Specifically, the wiring pattern 32 has a ground electrode 34, to which the bottom (electrode) of the photoelectric device 26 is bonded. The ground electrode 34 is integrated with a side electrode 36 and is electrically connected to the pedestal portion 18 on a side opposite to the mounting surface. The wiring pattern 32 has a signal electrode 38, through which high-frequency signals are input to the photoelectric device 26.

As shown in FIG. 2, the optical module 100 has a relay board 40. The relay board 40 has a top 42 and a bottom 44 defining a thickness. At both ends of the top 42 (or bottom 44), a first end face 46 and a second end face 48 are connected. The second end face 48 is a surface opposite to the first end face 46. The top 42 has a slope 50 at least at a position closer to the first end face 46 than the second end face 48. The slope 50 inclines such that the thickness decreases in a direction from the first end face 46 to the second end face 48. The first end face 46 is opposed to and fixed to the first surface 12 of the conductive block 10. For being fixed, the first end face 46 should be large, to some extent, and there is a limit in thinning the relay board 40.

Figure 4:
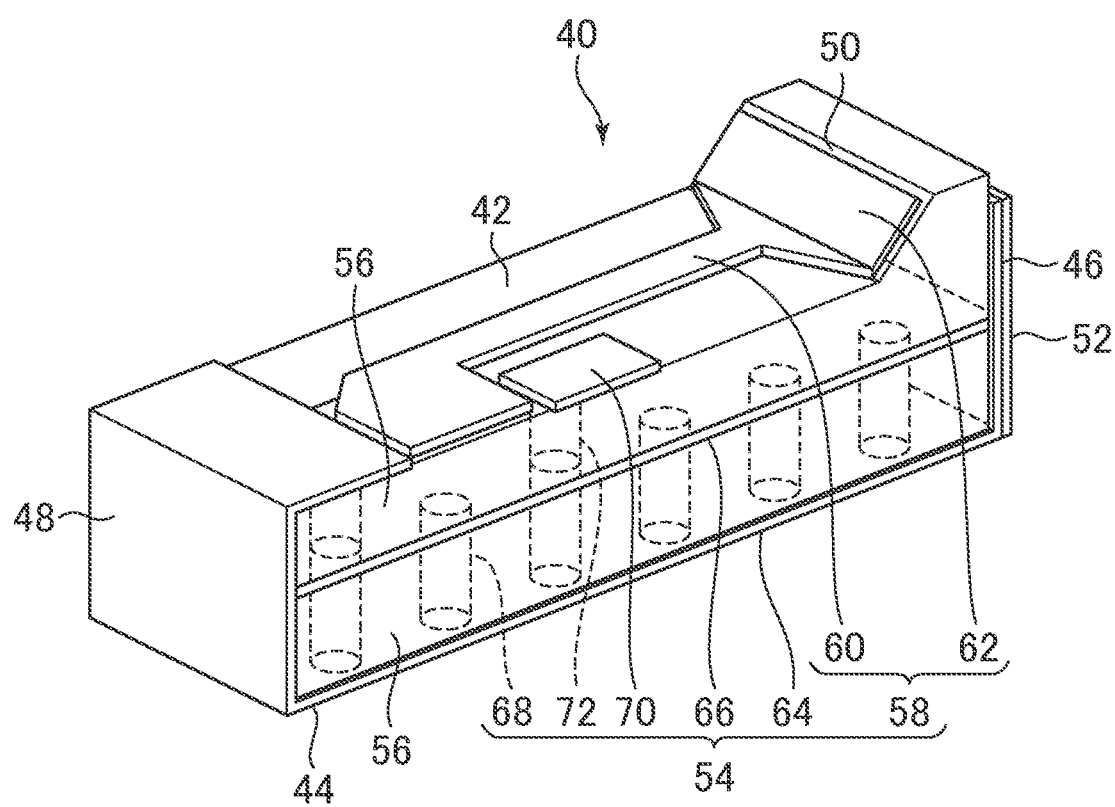
FIG. 4 is a detailed view of a relay board.

FIG. 4 is a detailed view of the relay board 40. A conductive adhesive 52 is interposed between the first surface 12 and the first end face 46. The relay board 40 is fixed to the conductive block 10 with the conductive adhesive 52. The relay board 40 may be supported by the conductive block 10 only at the first end face 46. At least part of the relay board 40 (first end face 46), as shown in FIG. 2, does not overlap with any of the through holes 16 (insulating material 20), so that the adhesive strength of the conductive adhesive 52 is ensured. The relay board 40 has a structure in which some conductor layers 54 (e.g., metals) are disposed and an insulating layer 56 (e.g., ceramic) is interposed between them.

(Signal Pattern)

The conductor layers 54 include a signal pattern 58. The signal pattern 58 is located on the top 42. The signal pattern 58 has a portion disposed on the slope 50. The signal pattern 58 includes a signal line 60. The signal pattern 58 includes a pad portion 62 larger than a line width of the signal line 60. The pad portion 62 is located on the slope 50.

(First Ground Pattern)

The conductor layers 54 has a first ground pattern 64. The first ground pattern 64 extends from the bottom 44 to each of the first end face 46 and the second end face 48. With the conductive adhesive 52, on the first end face 46, the first ground pattern 64 is electrically connected to the conductive block 10. The first ground pattern 64 extends beyond the second end face 48 to the top 42.

(Second Ground Pattern)

The conductor layers 54 has a second ground pattern 66. The second ground pattern 66 is positioned in an inner layer of the relay board 40 and is electrically connected to the first ground pattern 64. The conductor layers 54 include a first vias 68. The first vias 68 penetrate the insulating layer 56 and connect the first ground pattern 64 and the second ground pattern 66.

The second ground pattern 66 is closer to the signal pattern 58 than the first ground pattern 64. Therefore, it is possible to increase the capacitance (prevent the capacitance from decreasing). At the slope 50, the signal pattern 58 is away from the second ground pattern 66, but the pad portion 62 is larger than the signal line 60, thereby preventing the decrease in the capacitance. There is the second ground pattern 66 on one surface of the insulating layer 56 (dielectric), and there is the signal pattern 58 on another surface of the dielectric, whereby they constitute a microstrip line.

(Third Ground Pattern)

The conductor layers 54 include a third ground pattern 70. The third ground pattern 70 is positioned on the top 42 and is electrically connected to the second ground pattern 66. The conductor layers 54 include second vias 72. The second vias 72 penetrate the insulating layer 56 and connect the second ground pattern 66 and the third ground pattern 70.

(Wires)

As shown in FIG. 2, the optical module 100 has some wires. In the embodiment, use of the wires instead of using an expensive pellet can minimize the cost.

One end of a signal wire 74 is bonded to the signal lead pin 22. The signal wire 74 is bonded to the distal end face of the signal lead pin 22. The distal end face of the signal lead pin 22 is larger than the diameter of the held portion 24 to secure a bonding area. Another end of the signal wire 74 is bonded to the signal pattern 58 at the slope 50. The signal wire 74 electrically connects the signal lead pin 22 and the signal pattern 58. Incidentally, the use of the signal wire 74 may increase the inductance, but the increase in the capacitance at the slope 50 can balance the impedance.

One end of a wire W1 is bonded to the signal pattern 58 on the top 42 of the relay board 40. Another end of the wire W1 is bonded to the signal electrode 38 (FIG. 3). The signal electrode 38 and the photoelectric device 26 are connected through a wire W7.

One end of a ground wire 76 is bonded to the first ground pattern 64 on the second end face 48. Another end of the ground wire 76 is bonded to the pedestal portion 18. One end of a wire W2 is bonded to the first ground pattern 64 on the top 42 of the relay board 40. Another end of the wire W2 is bonded to the ground electrode 34 (FIG. 3) of the mounting substrate 28. One end of a wire W3 is bonded to the first ground pattern 64 on the bottom 44 of the relay board 40. Another end of the wire W3 is bonded to the pedestal portion 18.

One end of a wire W4 is bonded to the third ground pattern 70 (FIG. 4) on the top 42 of the relay board 40. Another end of the wire W4 is bonded to the pedestal portion 18. An upper electrode of the bypass capacitor 30 is connected to the lead pin L through a wire W5, whereby voltage is applied. The voltage is also connected to the photoelectric device 26 through another wire W6, whereby power supply voltage is applied. The photoelectric device 26 is also connected to the signal electrode 38 (FIG. 3) through a wire W7.

(Manufacturing Method)

Figure 5:
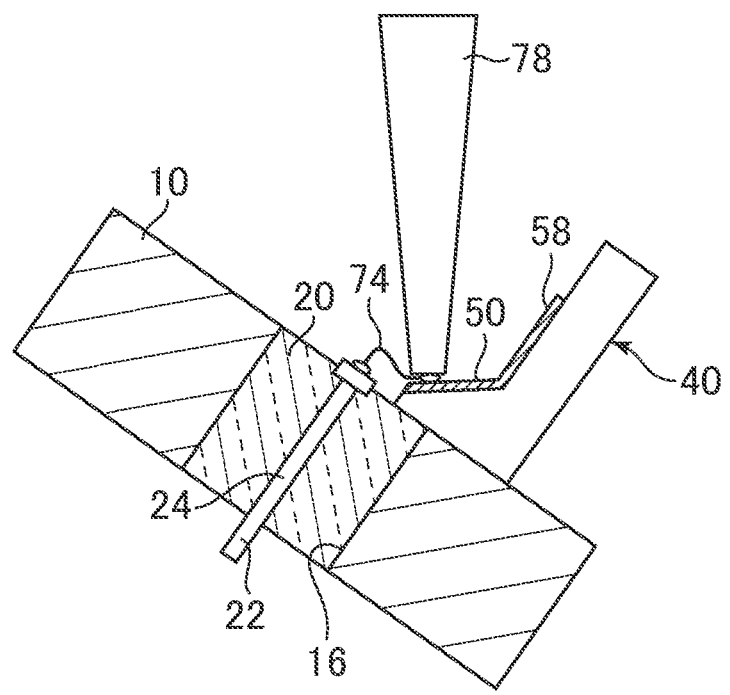
FIG. 5 is a diagram for explaining wire bonding.

FIG. 5 is a diagram for explaining the wire bonding. A method of manufacturing the optical module 100 includes the wire bonding. A capillary 78 is used to bond the one end of the signal wire 74 to the distal end face of the signal lead pin 22.

Subsequently, the other end of the signal wire 74 is bonded to the signal pattern 58 at the slope 50. This bonding is performed by tilting the conductive block 10 so that the slope 50 is perpendicular to the capillary 78. Bonding to the slope 50 can avoid interference with other components, irrespective of component variation, enabling stable production.

In the embodiment, bonding the signal wire 74 to the slope 50 can simplify the bonding process, enable use of a short signal wire 74, and minimize the inductance. This makes it possible to improve the characteristics.

Second Embodiment

Figure 6:
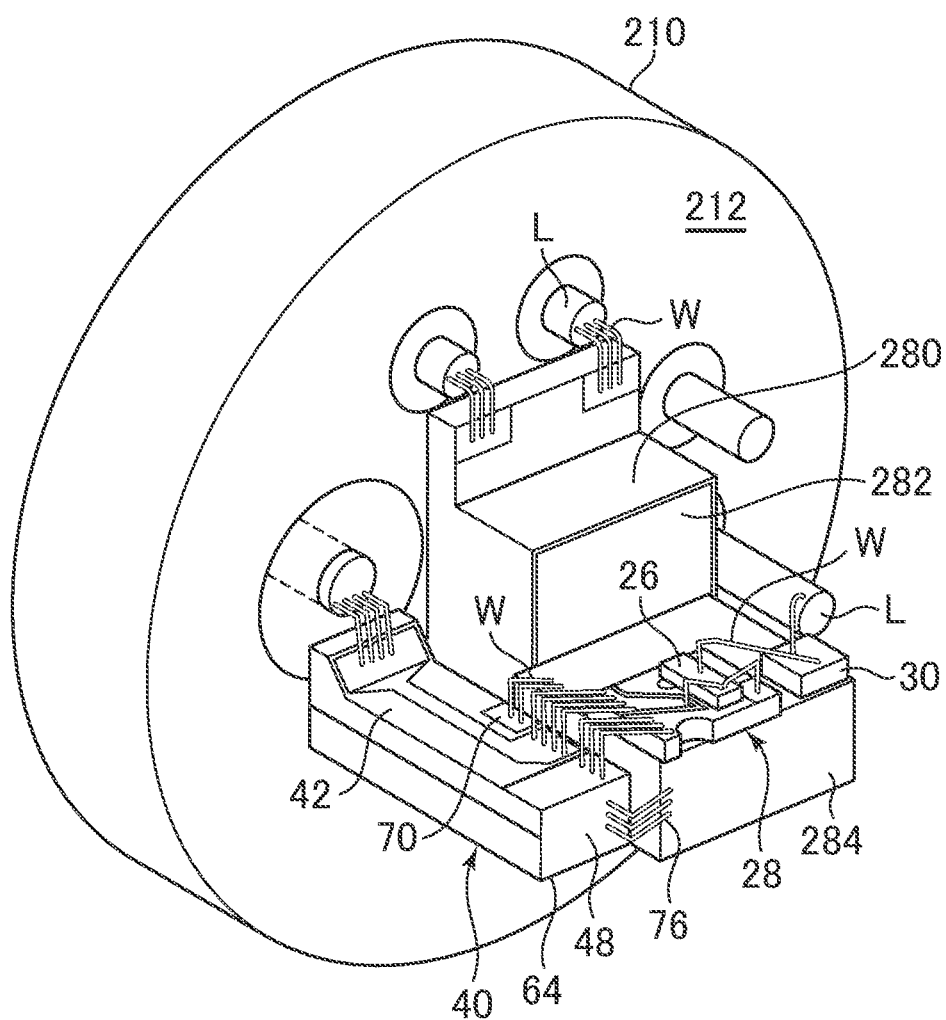
FIG. 6 is a perspective view of part of an optical module in a second embodiment.

FIG. 6 is a perspective view of part of an optical module in a second embodiment. The optical module has a thermoelectric cooler 280. The thermoelectric cooler 280 has an upper surface and a lower surface. The upper surface and the lower surface are made of an insulator such as ceramic. The lower surface is fixed to the first surface 212 of the conductive block 210. A thermally conductive adhesive may be used for fixing. Thermoelectric cooler 280 has a Peltier element (not shown) therein configured to transfer heat between the upper surface and the lower surface. For example, the upper surface is a heat absorbing surface and the lower surface is a heat radiating surface, or they can be switched vice versa. An electrode of the thermoelectric cooler 280 is connected to the lead pin L through a wire W.

A metal layer 282 is laminated on the upper surface of the thermoelectric cooler 280. The metal layer 282 serves as a reference potential plane (e.g., ground plane). A support block 284 is interposed between the metal layer 282 and the mounting substrate 28 (FIG. 3). The support block 284 is made of a metal that is a conductive material. The support block 284 conducts with the metal layer 282, and conducts to the ground electrode 34 through the side electrode 36 of the mounting substrate 28.

One end of the ground wire 76 is bonded to the first ground pattern 64 on the second end face 48. Another end of the ground wire 76 is bonded to the support block 284. On the top 42 of the relay board 40, one end of a wire W is bonded to the third ground pattern 70. Another end of the wire W is bonded to the support block 284.

The bypass capacitor 30 is mounted on the support block 284. The bottom (electrode) of the bypass capacitor 30 is conducted to the support block 284, being connected to the reference potential (e.g., ground). Another electrode of the bypass capacitor 30 is connected to the lead pin L through a wire W, whereby a voltage is applied. The voltage is also connected to the photoelectric device 26 through another wire W, whereby power supply voltage is applied. The contents described in the first embodiment are applicable to this embodiment.

Third Embodiment

Figure 7:
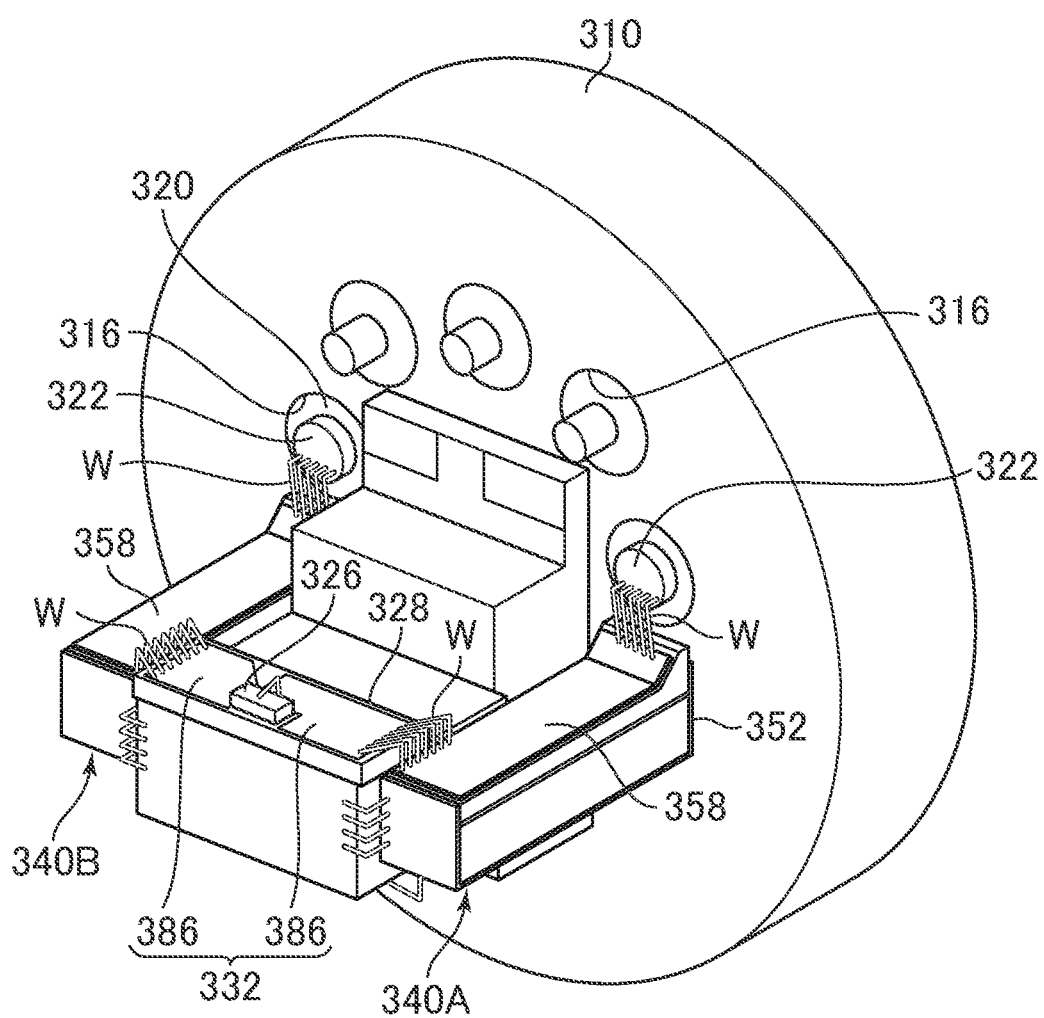
FIG. 7 is a perspective view of part of an optical module in a third embodiment.

FIG. 7 is a perspective view of part of an optical module in a third embodiment. The signal pattern 358 of the first relay board 340A and the signal pattern 358 of the second relay board 340B constitute a differential transmission line. The signal pattern 358 may be symmetrical in a shape with reference to the signal transmission direction. The first relay board 340A and the second relay board 340B having the same structure can cut costs by sharing parts thereof.

A direct modulation laser (DML) is assumed as the photoelectric device 326 capable of differential driving. Due to general necessity of being driven by a high current, the DML tends to have its characteristic impedance set lower to achieve low power consumption. A high-frequency line generally has its characteristic impedance set to 25Ω. To match the characteristic impedance to 25Ω, the signal pattern 358 has its linewidth relatively large (about 0.5 to 0.7 mm). In the first embodiment, a single-phase method of 50Ω matching is assumed.

Each of the first relay board 340A and the second relay board 340B entirely overlaps with none of the through holes 316. An insulating material 320 inside the through hole 316 has a weak adhesive strength with the conductive adhesive 352, but the conductive adhesive 352 is not adhered to the insulating material 320, making strong adhesion between the conductive block 310 and each of the first relay board 340A and the second relay board 340B.

A wiring pattern 332 of the mounting substrate 328 includes a pair of differential signal lines 386. A back electrode (not shown) of the photoelectric device 326 is electrically connected to one of the pair of differential signal lines 386. Another of the pair of differential signal lines 386 and the photoelectric device 326 are connected to each other with a wire W.

Each of a pair of signal patterns 358 is connected to a corresponding one of the pair of differential signal lines 386 through a wire W. Each of the pair of signal patterns 358 is also connected to a corresponding signal lead pin 322 through wires W. Thus, the pair of signal lead pins 322 are electrically connected to the photoelectric device 326. The contents described in the first embodiment are applicable to this embodiment.

Fourth Embodiment

Figure 8:
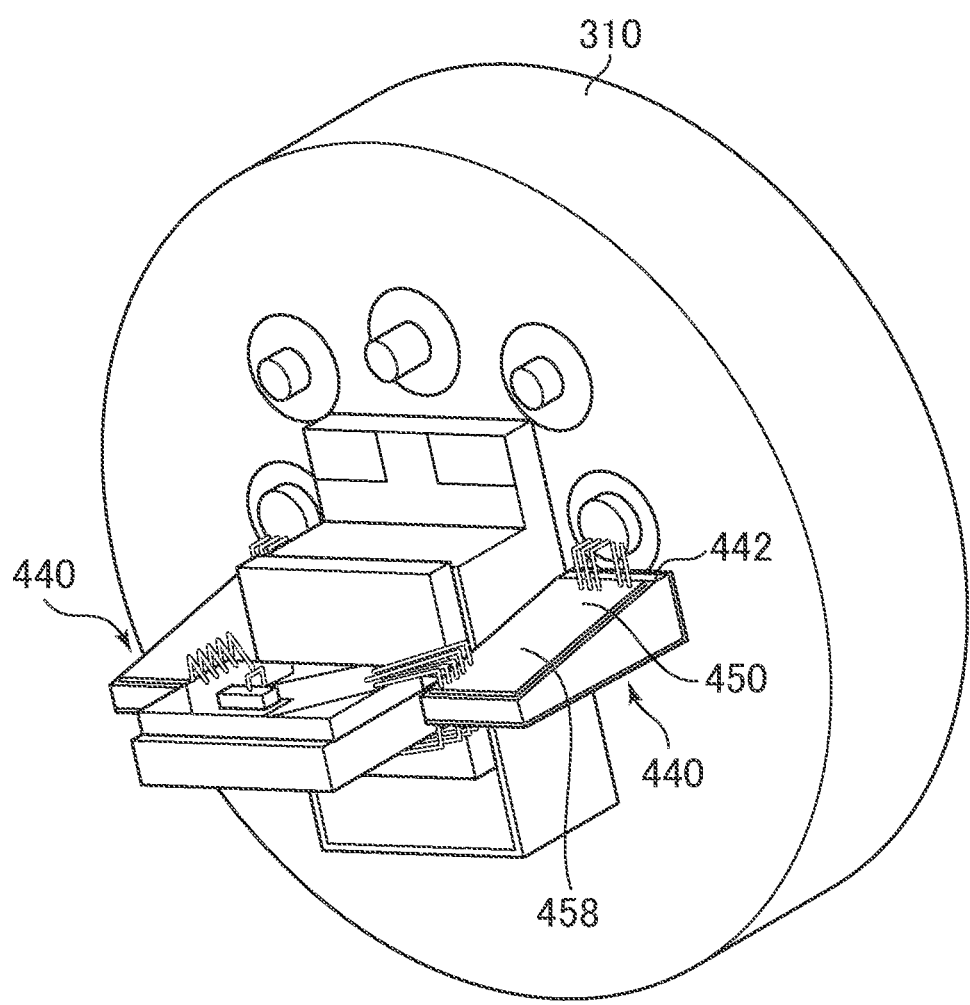
FIG. 8 is a perspective view of part of an optical module in a fourth embodiment.

FIG. 8 is a perspective view of part of an optical module in a fourth embodiment. In this embodiment, on the top 442 of the relay board 440, there is a signal pattern 458 all over the slope 450. The entire top 442 may be the slope 450. This can reduce the thickness of the relay board 440, whereby the impedance can be closer to a desired value without having a ground pattern in an inner layer, leading to a configuration excellent in cost tolerance. The contents described in the third embodiment are applicable to the present embodiment.

Fifth Embodiment

Figure 9:
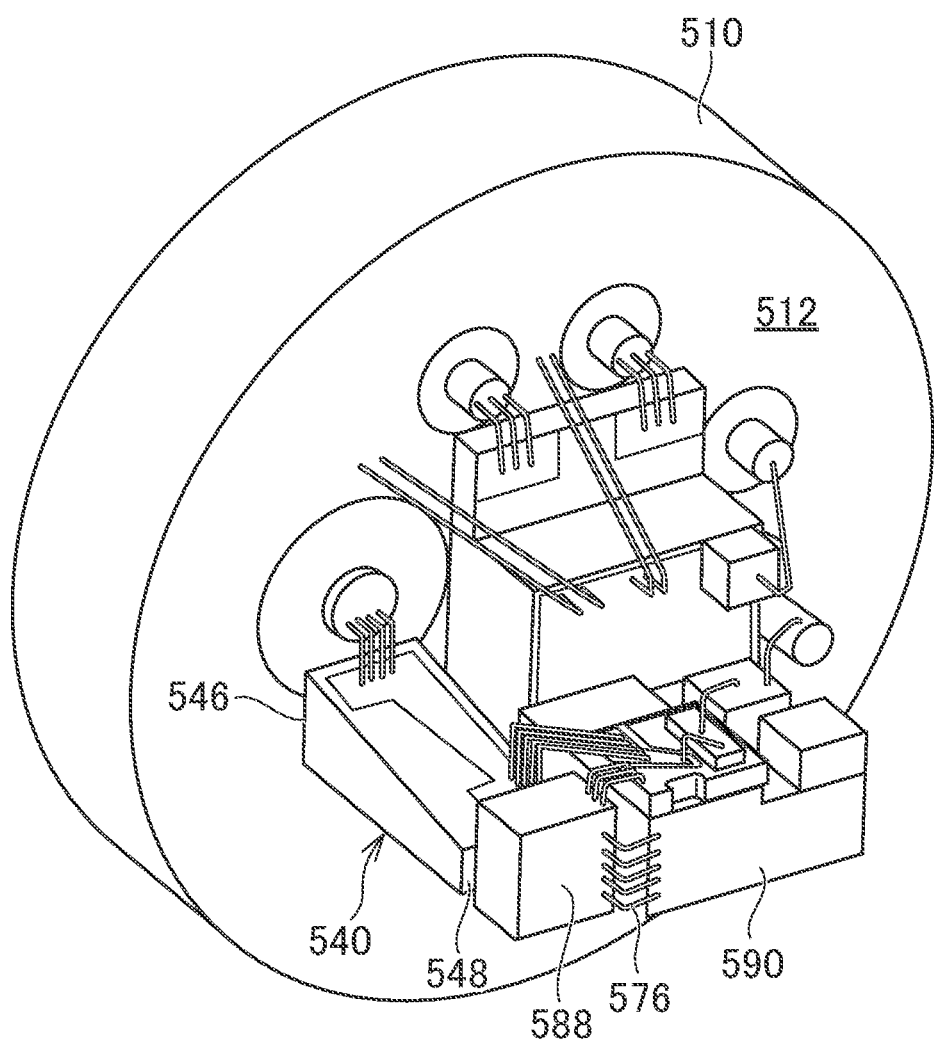
FIG. 9 is a perspective view of part of an optical module in a fifth embodiment.
Figure 10:
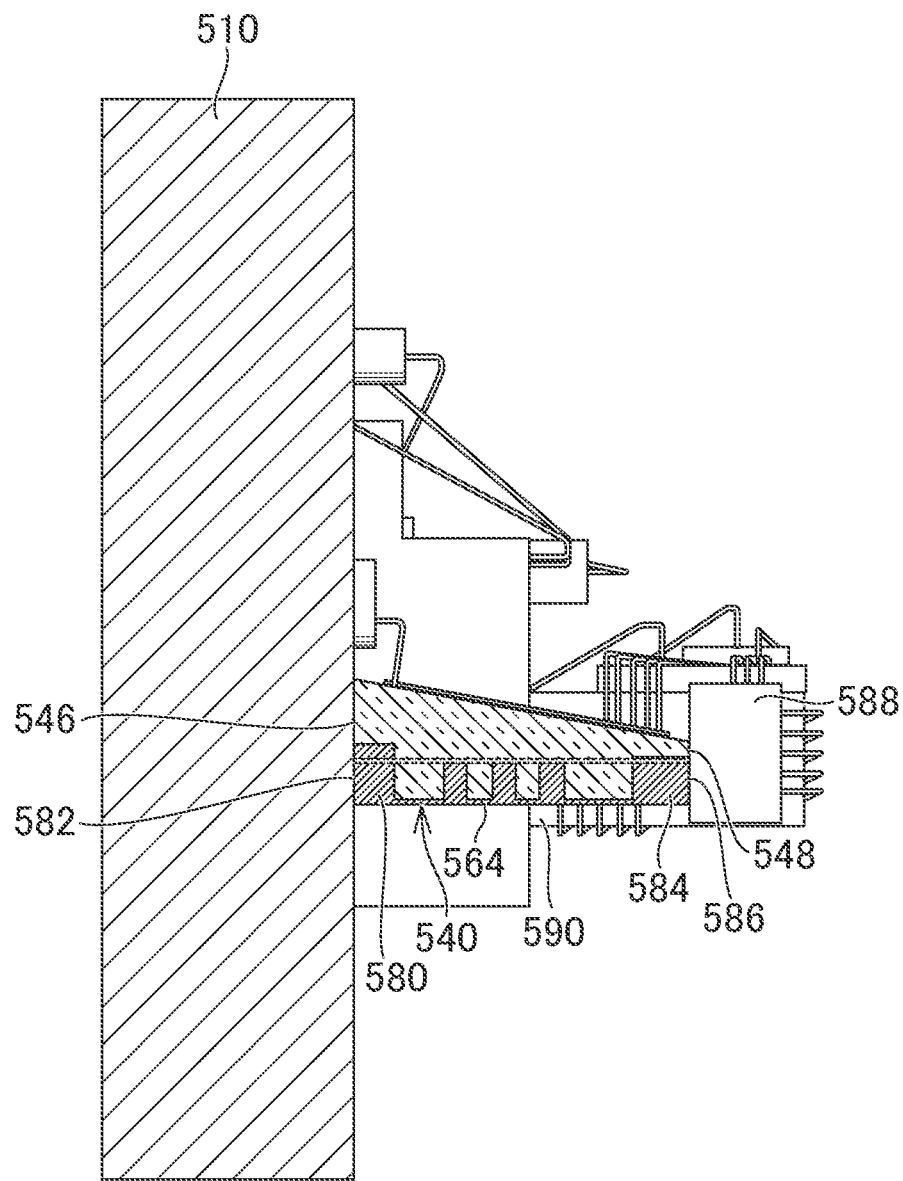
FIG. 10 is a cross-sectional view of the part of the optical module in the fifth embodiment.

FIG. 9 is a perspective view of part of an optical module in a fifth embodiment. FIG. 10 is a cross-sectional view of the part of the optical module in the fifth embodiment. In the embodiment, a single-end method is employed for transmission of digital data. The optical module has a relay board 540 with two or more layers.

Figure 11:
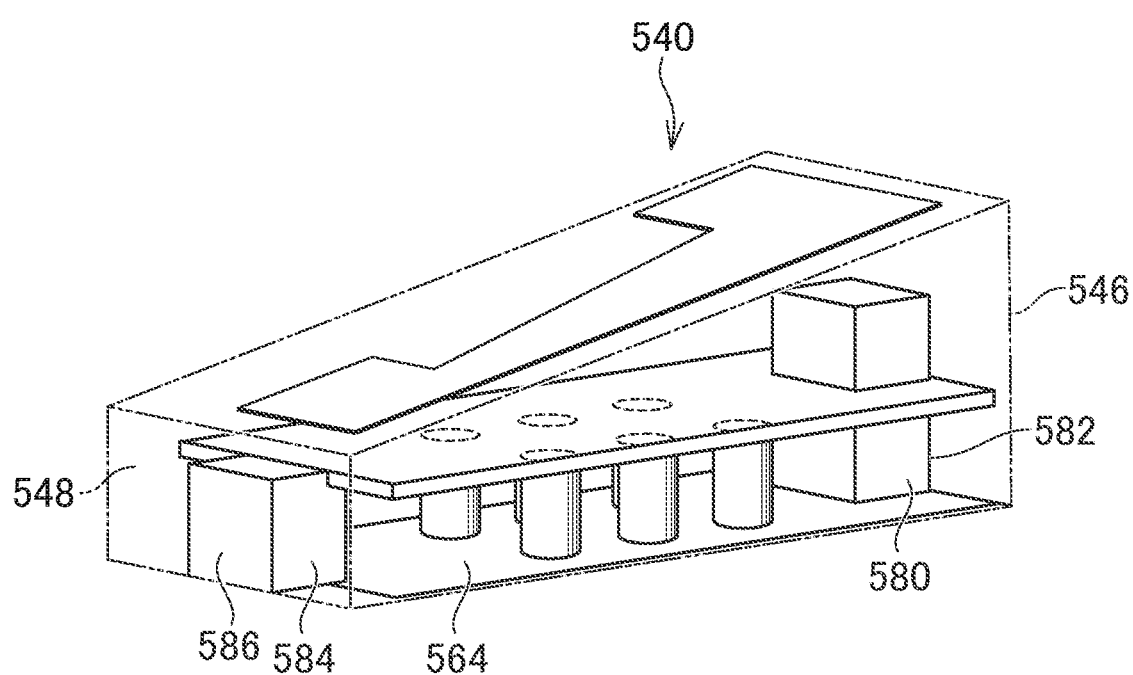
FIG. 11 is a perspective view of a relay board of the optical module in the fifth embodiment.

FIG. 11 is a perspective view of the relay board 540 of the optical module in the fifth embodiment. The relay board 540 has a structure in which some conductor layers are disposed with an insulating layer interposed therebetween. The embodiment is different from the second embodiment (FIG. 6) in the relay board 540.

The relay board 540 has a first conductor 580 (e.g., embedded via). The first conductor 580 is embedded in the relay board 540 (insulating layer) and is connected to the first ground pattern 564. The first conductor 580 has a first bare surface 582 exposed to the first end face 546. The first end face 546 of the relay board 540 is opposed to and fixed to the first surface 512 of the conductive block 510. A conductive adhesive may be used for fixation. The first conductor 580 is electrically connected to the conductive block 510.

The relay board 540 has a second conductor 584 (e.g., embedded via). The second conductor 584 is embedded in the relay board 540 (insulating layer) and is connected to the first ground pattern 564. The second conductor 584 has a second bare surface 586 exposed to the second end face 548. The second end face 548 is opposite to the first end face 546.

The optical module has a conductive piece 588. The conductive piece 588 is entirely made of a conductive material. The conductive piece 588 at least on its surface is made of a conductive material, and is in surface contact with and electrically connected to the second bare surface 586 of the second conductor 584. One end of the ground wire 576 is bonded to the surface of the conductive piece 588. The ground wire 576 is electrically connected to the first ground pattern 564 through the conductive piece 588. Another end of the ground wire 576 is connected to the support block 590. With respect to other contents, what has been described in the second embodiment is applicable to this embodiment.

Sixth Embodiment

Figure 12:
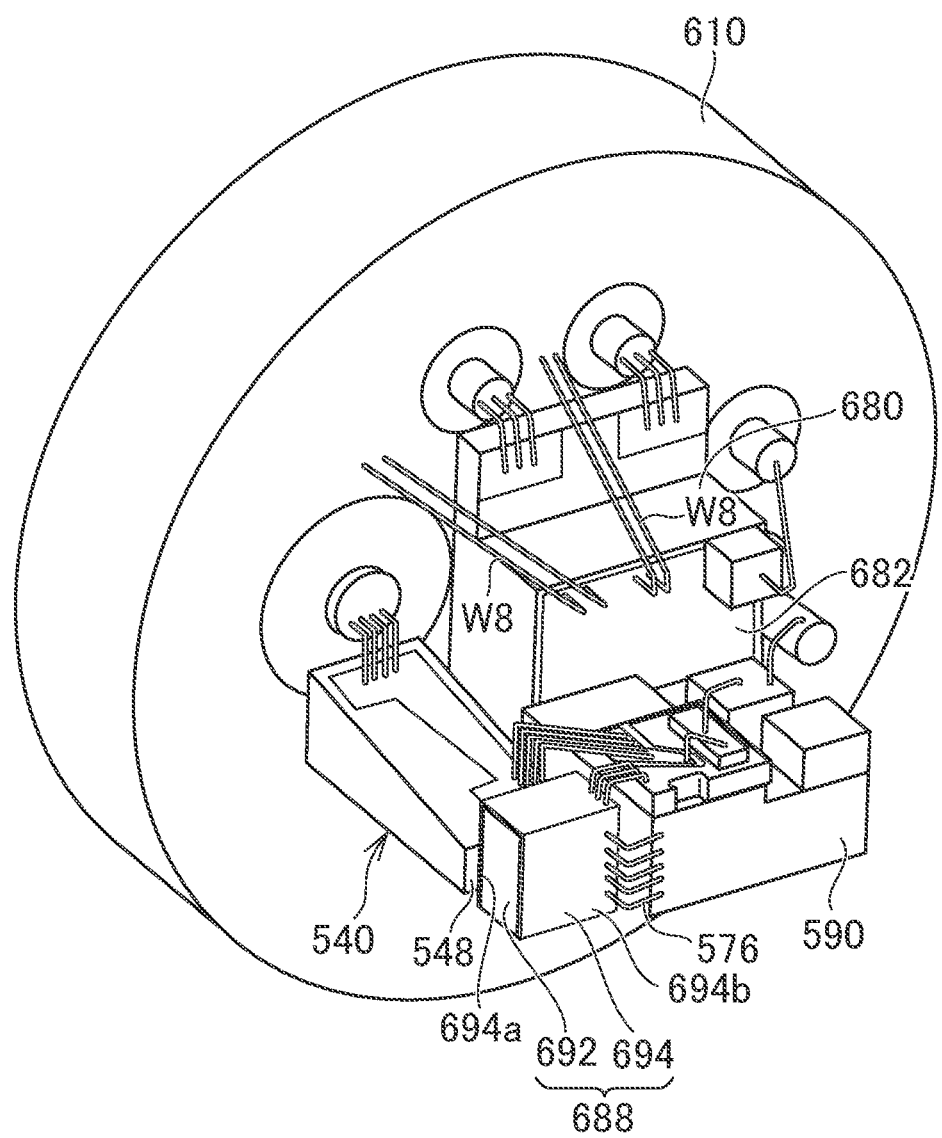
FIG. 12 is a perspective view of part of an optical module in a sixth embodiment.
Figure 13:
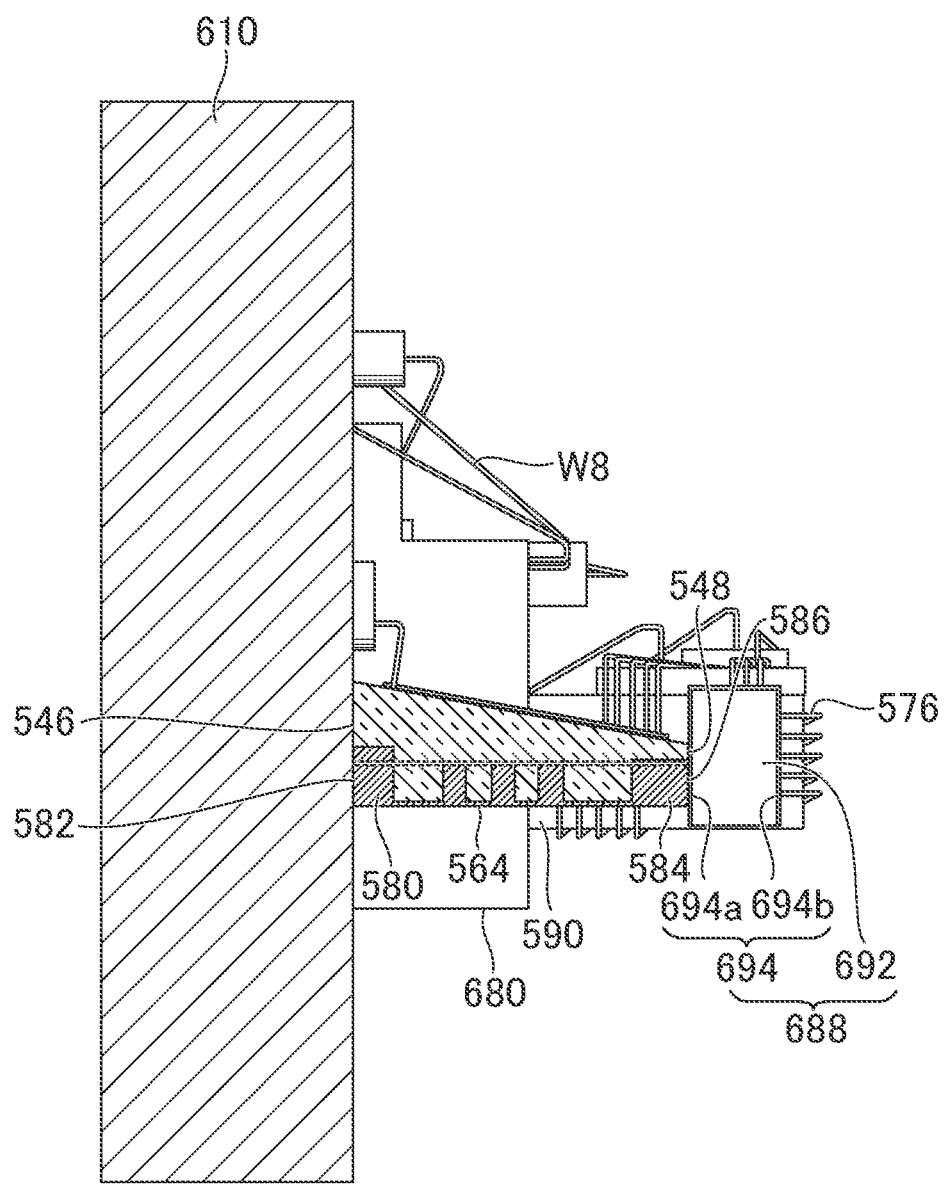
FIG. 13 is a cross-sectional view of part of the optical module in the sixth embodiment.

FIG. 12 is a perspective view of part of an optical module in a sixth embodiment. FIG. 13 is a cross-sectional view of part of the optical module in the sixth embodiment. In the embodiment, the relay board 540 (FIG. 11) described in the fifth embodiment is used.

This embodiment differs from the fifth embodiment (FIG. 9) in the conductive piece 688. The conductive piece 688 includes a main body 692 made of an insulating material. The main body 692 is a polyhedron having some planes. The conductive piece 688 includes a metal film 694 formed on a main body 692.

The metal film 694 has a portion 694a formed on a surface, of the main body 692, facing the second end face 548. That is, the portion 694a of the metal film 694 is a connection part with the second bare surface 586 of the second conductor 584. The conductive piece 688 is electrically connected to the first ground pattern 564 through the second conductor 584.

The metal film 694 has another portion 694b formed on a surface, of the main body 692, opposite to the surface facing the second end face 548. The other portion 694b of the metal film 694 is not opposed to the second end face 548 of the relay board 540. The metal film 694 is formed over three or more surfaces of the main body 692, and is continuously integrated.

The other portion 694b of the metal film 694 is a bonding portion to the ground wire 576. The ground wire 576 is electrically connected to the second conductor 584 through the metal film 694. Through the ground wire 576, the ground potential is transmitted to the support block 590 and is stabilized. Incidentally, as shown in FIG. 12, the metal layer 682 of the thermoelectric cooler 680 and the conductive block 610 are connected to each other through a wire W8, thereby also strengthening the ground.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
a conductive block with a first surface and a second surface, the conductive block having some through holes extending therethrough between the first surface and the second surface;
some lead pins including a signal lead pin, the lead pins fixed inside the respective through holes and insulated from the conductive block;
a relay board including two or more layers in which some conductor layers are arranged with an insulating layer interposed therebetween;
a photoelectric device configured to convert an optical signal and an electrical signal at least from one to another; and
some wires including a signal wire,
wherein
the relay board includes a first end face opposed to and fixed to the first surface of the conductive block, the relay board including a second end face opposite to the first end face, the relay board including a top and a bottom defining thickness of the relay board between the first end face and the second end face,
the top has a slope at least at a position closer to the first end face than the second end face, the slope inclining such that the thickness decreases in a direction from the first end face to the second end face,
the conductor layers include a signal pattern on the top with part of the signal pattern disposed on the slope, the conductor layers including a first ground pattern extending from the bottom to each of the first end face and the second end face, and
the signal wire has one end bonded to the signal lead pin and another end bonded to the signal pattern on the slope.

2. The optical module according to claim 1, wherein the conductor layers include a second ground pattern located in an inner layer of the relay board and electrically connected to the first ground pattern.

3. The optical module according to claim 1, wherein the wires include a ground wire with one end bonded to the first ground pattern on the second end face.

4. The optical module according to claim 3, wherein
the conductive block has a pedestal portion raised on the first surface, and
the ground wire has another end bonded to the pedestal portion.

5. The optical module according to claim 1, further comprising a conductive adhesive interposed between the first surface and the first end face, adapted to electrically connect the first ground pattern to the conductive block, and adapted to fix the relay board to the conductive block.

6. The optical module according to claim 1, wherein the relay board is supported by the conductive block only at the first end face.

7. The optical module according to claim 1, wherein at least part of the relay board does not overlap with any one of the through holes.

8. The optical module according to claim 1, wherein the signal wire is bonded to a distal end face of the signal lead pin.

9. The optical module according to claim 8, wherein
the signal lead pin has a held portion located inside a corresponding one of the through holes, and
the distal end face is larger than a diameter of the held portion.

10. The optical module according to claim 1, wherein the wires further include a wire bonded to the signal pattern on the top.

11. The optical module according to claim 1, wherein the signal pattern includes a signal line and a pad portion larger than a line width of the signal line, the pad portion positioned on the slope.

12. The optical module according to claim 1, wherein the first ground pattern is configured to extend from the bottom to the second end face.

13. The optical module according to claim 12, wherein the first ground pattern is configured to extend beyond the second end face to the top.

14. The optical module according to claim 13, wherein the wires further include a wire bonded to the first ground pattern on the top.

15. The optical module according to claim 1, wherein
the relay board is each of a first relay board and a second relay board, and
the signal pattern of the first relay board and the signal pattern of the second relay board constitute a differential transmission line.

16. An optical module comprising:
a conductive block with a first surface and a second surface, the conductive block having some through holes extending therethrough between the first surface and the second surface;
some lead pins including a signal lead pin, the lead pins fixed inside the respective through holes and insulated from the conductive block;
a relay board including two or more layers in which some conductor layers are arranged with an insulating layer interposed therebetween;
a photoelectric device configured to convert an optical signal and an electrical signal at least from one to another; and
some wires including a signal wire,
wherein
the relay board includes a first end face opposed to and fixed to the first surface of the conductive block, the relay board including a second end face opposite to the first end face, the relay board including a top and a bottom defining thickness of the relay board between the first end face and the second end face,
the top has a slope inclining such that the thickness decreases in a direction from the first end face to the second end face,
the conductor layers include a signal pattern on the slope, the conductor layers including a first ground pattern on the bottom, the conductor layers including a first conductor embedded in the relay board, the first conductor including a first bare surface exposed to the first end face, the first conductor connected to the first ground pattern, and
the signal wire has one end bonded to the signal lead pin and another end bonded to the signal pattern on the slope.

17. The optical module according to claim 16, wherein the conductor layers further include a second conductor embedded in the relay board, the second conductor including a second bare surface exposed to the second end face, the second conductor connected to the first ground pattern.

18. The optical module according to claim 17, further comprising a conductive piece in face contact with the second bare surface of the second conductor, at least a surface of the conductive piece made of a conductive material,
wherein the wires include a ground wire with one end bonded to the surface of the conductive piece.

19. The optical module according to claim 18, wherein the conductive piece is entirely made of the conductive material.

20. The optical module according to claim 18, wherein
the conductive piece includes a main body made of an insulating material, the conductive piece including a metal film on the main body,
one portion of the metal film is a connection portion to the second bare surface, and
another portion of the metal film is a bonding portion to the ground wire, without being opposed to the second end face.

21. The optical module according to claim 18, further comprising:
a mounting substrate on which the photoelectric device is mounted; and
a support block configured to support the mounting substrate, made of a conductive material, and bonded to another end of the ground wire.

* * * * *